US009812362B2

United States Patent
Takeda et al.

(10) Patent No.: US 9,812,362 B2
(45) Date of Patent: Nov. 7, 2017

(54) WAFER PROCESSING METHOD (71) Applicant: DISCO CORPORATION, Tokyo (JP)

(72) Inventors: Noboru Takeda, Tokyo (JP); Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/450,828

(22) Filed: Mar. 6, 2017

(65) Prior Publication Data

US 2017/0256454 A1    Sep. 7, 2017

(30) Foreign Application Priority Data

Mar. 7, 2016    (JP) .................................. 2016-043136

(51) Int. Cl.
*H01L 21/00*    (2006.01)
*H01L 21/78*    (2006.01)
*H01L 21/683*    (2006.01)

(52) U.S. Cl.
CPC .......... *H01L 21/78* (2013.01); *H01L 21/6836* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC ................ H01L 21/78; H01L 21/6836; H01L 2221/68318; H01L 2221/68327; H01L 2221/6834; H01L 2221/68381
USPC ................................. 438/114, 460, 462, 463
See application file for complete search history.

(56) References Cited

U.S. PATENT DOCUMENTS

| | | | |
|---|---|---|---|
| 7,919,395 B2 * | 4/2011 | Morikazu | B28D 5/0011 438/460 |
| 9,093,518 B1 * | 7/2015 | Lei | H01L 21/6836 |
| 9,123,794 B2 * | 9/2015 | Amano | C09J 7/0203 |
| 9,147,599 B2 * | 9/2015 | Nakajima | H01L 21/187 |
| 9,165,832 B1 * | 10/2015 | Papanu | H01L 21/78 |
| 9,349,648 B2 * | 5/2016 | Lei | H01L 21/0337 |
| 9,412,619 B2 * | 8/2016 | Kumar | H01L 21/3221 |
| 9,446,479 B2 * | 9/2016 | Wei | H01L 21/67092 |
| 9,576,835 B2 * | 2/2017 | Wei | H01L 21/6835 |
| 9,688,533 B2 * | 6/2017 | Bozorgi | B81C 1/00269 |
| 9,704,984 B2 * | 7/2017 | Hirler | H01L 29/7811 |
| 2008/0217312 A1 * | 9/2008 | Tokura | B23K 26/38 219/121.72 |

(Continued)

FOREIGN PATENT DOCUMENTS

JP    2010-103327    5/2010
JP    2012-081551    4/2012

*Primary Examiner* — Caleb Henry
(74) *Attorney, Agent, or Firm* — Greer Burns & Crain, Ltd.

(57) ABSTRACT

Disclosed herein is a wafer processing method including a cover plate providing step of providing a cover plate on the front side of a wafer to thereby form a composite wafer, a welding step of applying a laser beam along each division line formed on the front side of the wafer in the condition where the focal point of the laser beam is set at the interface between the wafer and the cover plate on opposite sides of the lateral center of each division line, thereby forming two parallel welded lines for joining the wafer and the cover plate along each division line, and a dividing step of forming a cut line between the two parallel welded lines formed along each division line, thereby cutting the composite wafer along each division line to obtain individual device chips each covered with the cover plate.

4 Claims, 5 Drawing Sheets

(56) References Cited

U.S. PATENT DOCUMENTS

| | | | |
|---|---|---|---|
| 2014/0038392 A1* | 2/2014 | Yonehara | H01L 21/304 438/463 |
| 2014/0126167 A1* | 5/2014 | Bozorgi | B81C 1/00269 361/760 |
| 2014/0305916 A1* | 10/2014 | Wei | H01L 21/67092 219/121.64 |
| 2015/0140735 A1* | 5/2015 | Hosseini | B81C 1/00634 438/107 |
| 2016/0238855 A1* | 8/2016 | Kriman | G02B 27/4277 |

* cited by examiner

FIG.5C ly be understood from a study of the following description and
WAFER PROCESSING METHOD

BACKGROUND OF THE INVENTION

Field of the Invention

The present invention relates to a wafer processing method for dividing a wafer into individual device chips along a plurality of crossing division lines, the front side of the wafer being partitioned by the division lines to define a plurality of separate regions where a plurality of devices corresponding to the device chips are formed, the front side of the wafer being previously covered with a cover plate.

Description of the Related Art

A plurality of devices such as integrated circuits (ICs), large-scale integrations (LSIs), charge-coupled devices (CCDs), and micro electro mechanical systems (MEMS) devices are formed on the front side of a wafer so as to be separated from each other by a plurality of division lines. The wafer thus having the devices on the front side is divided into individual device chips by a dicing apparatus having a cutting blade or by a laser processing apparatus for applying a laser beam. The device chips thus obtained are used in electrical equipment such as mobile phones, personal computers, digital cameras, and medical equipment.

Of these various devices, an image sensor including a CCD and MEMS devices are delicate devices, and it is known that if the front side of such a delicate device is soiled or scratched, the quality of the device is remarkably reduced. To cope with this problem, it has been proposed to provide a glass plate on the front side of a wafer having such devices, thereby protecting the front side of each device (see Japanese Patent Laid-open Nos. 2012-081551 and 2010-103327, for example).

SUMMARY OF THE INVENTION

According to the technique proposed in Japanese Patent Laid-open Nos. 2012-081551 and 2010-103327, the front side of each device chip divided from the wafer can be protected by the glass plate provided on the front side of the wafer. However, in providing the glass plate on the wafer, an adhesive such as a bonding agent is used to attach the glass plate to the wafer. Accordingly, a careful operation is required so that the adhesive does not squeeze out between the glass plate and the wafer in bonding them together, causing a reduction in productivity. Further, after dividing the wafer into the individual device chips each covered with the glass plate, there is a possibility that the adhesive may appear to the side surface of each device chip, causing a reduction in quality of each device chip.

It is therefore an object of the present invention to provide a wafer processing method for dividing a wafer into individual device chips along a plurality of crossing division lines, the front side of the wafer being partitioned by the division lines to define a plurality of separate regions where a plurality of devices corresponding to the device chips are formed, the front side of the wafer being previously covered with a cover plate such as a glass plate, wherein a reduction in productivity can be prevented and a reduction in quality of each device chip can also be prevented.

In accordance with an aspect of the present invention, there is provided a wafer processing method for dividing a wafer into individual device chips along a plurality of crossing division lines, the front side of the wafer being partitioned by the division lines to define a plurality of separate regions where a plurality of devices corresponding to the device chips are formed, the wafer processing method including a cover plate providing step of providing a cover plate on the front side of the wafer to thereby form a composite wafer; a welding step of applying a laser beam having a transmission wavelength to the wafer or the cover plate along each division line in the condition where the focal point of the laser beam is set at the interface between the wafer and the cover plate on opposite sides of the lateral center of each division line, after performing the cover plate providing step, thereby forming two parallel welded lines for joining the wafer and the cover plate along each division line; and a dividing step of forming a cut line between the two parallel welded lines formed along each division line after performing the welding step, thereby cutting the composite wafer along each division line to obtain the individual device chips each covered with the cover plate.

Preferably, the dividing step is performed by rotating a cutting blade set at the lateral center between the two parallel welded lines. Alternatively, the dividing step is performed by applying a laser beam whose focal point is set at the lateral center between the two parallel welded lines.

Preferably, the wafer processing method further includes a supporting step of supporting the composite wafer through an adhesive tape to an annular frame having an inside opening in such a manner that the composite wafer is set in the inside opening closed by the adhesive tape, after performing the welding step and before performing the dividing step.

According to the wafer processing method of the present invention, the productivity can be improved and each device chip and the cover plate can be united without using an adhesive, thereby preventing a reduction in quality of each device chip.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
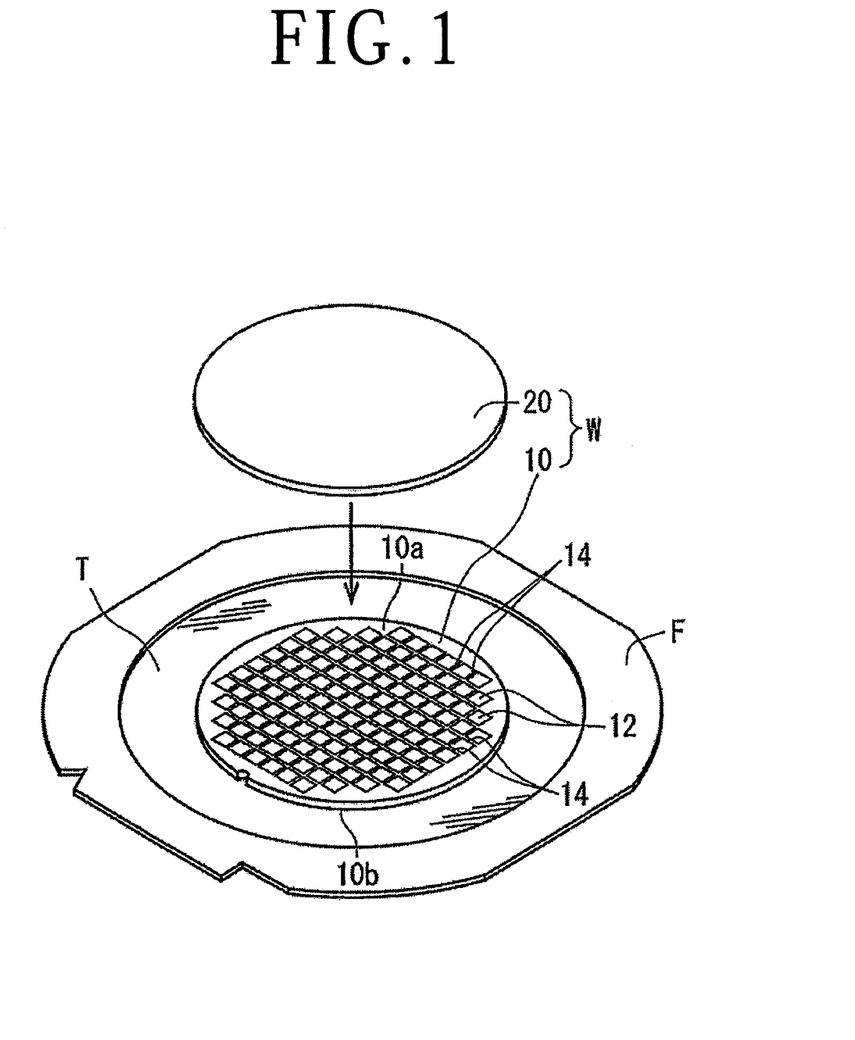
FIG. 1 is a perspective view showing a cover plate providing step of providing a cover plate on a wafer to form a composite wafer according to a preferred embodiment of the present invention.

A preferred embodiment of the wafer processing method according to the present invention will now be described in detail with reference to the attached drawings. FIG. 1 is a general perspective view showing a cover plate providing step of providing a cover plate 20 on the front side 10*a* of a wafer 10 to be processed by the wafer processing method according to the present invention.

The wafer 10 is formed of silicon, for example. The wafer 10 has a thickness of approximately 200 μm, for example. A plurality of crossing division lines 14 are formed on the front side 10*a* of the wafer 10. Each division line 14 has a width of approximately 50 μm, for example. The front side 10*a* of the wafer 10 is partitioned by the plural division lines 14 to thereby define a plurality of separate regions where a plurality of devices 12 are formed. In this preferred embodiment, each device 12 is an image sensor (e.g., CCD or complementary metal-oxide semiconductor (CMOS)). Prior to performing the cover plate providing step to be hereinafter described, the back side 10*b* of the wafer 10 is attached to an adhesive tape T supported at its peripheral portion to an annular frame F having an inside opening in such a manner that the wafer 10 is set in the inside opening closed by the adhesive tape T (supporting step). Accordingly, the wafer 10 is supported through the adhesive tape T to the annular frame F. That is, the wafer 10, the adhesive tape T, and the annular frame F are united together. The cover plate 20 is circular as similar to the wafer 10, and has substantially the same thickness as that of the wafer 10. The cover plate 20 is formed of colorless and transparent glass. In the case that each device 12 formed on the wafer 10 is not an image sensor, it is not necessarily required to select a colorless and transparent member as the cover plate 20, but any material not interfering with the use of each device 12 may be suitably selected as the material of the cover plate 20.

As shown in FIG. 1, the cover plate 20 is placed on the front side 10*a* of the wafer 10 supported through the adhesive tape T to the annular frame F. In this condition, a pressure is applied to the cover plate 20 from the upper side thereof to thereby unite the wafer 10 and the cover plate 20. Thus, a composite wafer W composed of the wafer 10 and the cover plate 20 is formed. This united condition is to be temporarily held until performing a welding step later, and any bonding means using an adhesive or the like is not essentially required. However, an adhesive may be slightly dropped at several positions on the peripheral portion of the wafer 10 where the devices 12 are not formed. Thereafter, the cover plate 20 may be pressed on the wafer 10 to temporarily bond the wafer 10 and the cover plate 20. In this case, the amount of the adhesive to be dropped onto the wafer 10 must be determined so that when the cover plate 20 is pressed on the wafer 10, the adhesive dropped on the wafer 10 is not spread to a device area on the front side 10*a* of the wafer 10 where the devices 12 are formed. In this manner, the cover plate providing step is completed.

Figure 2:
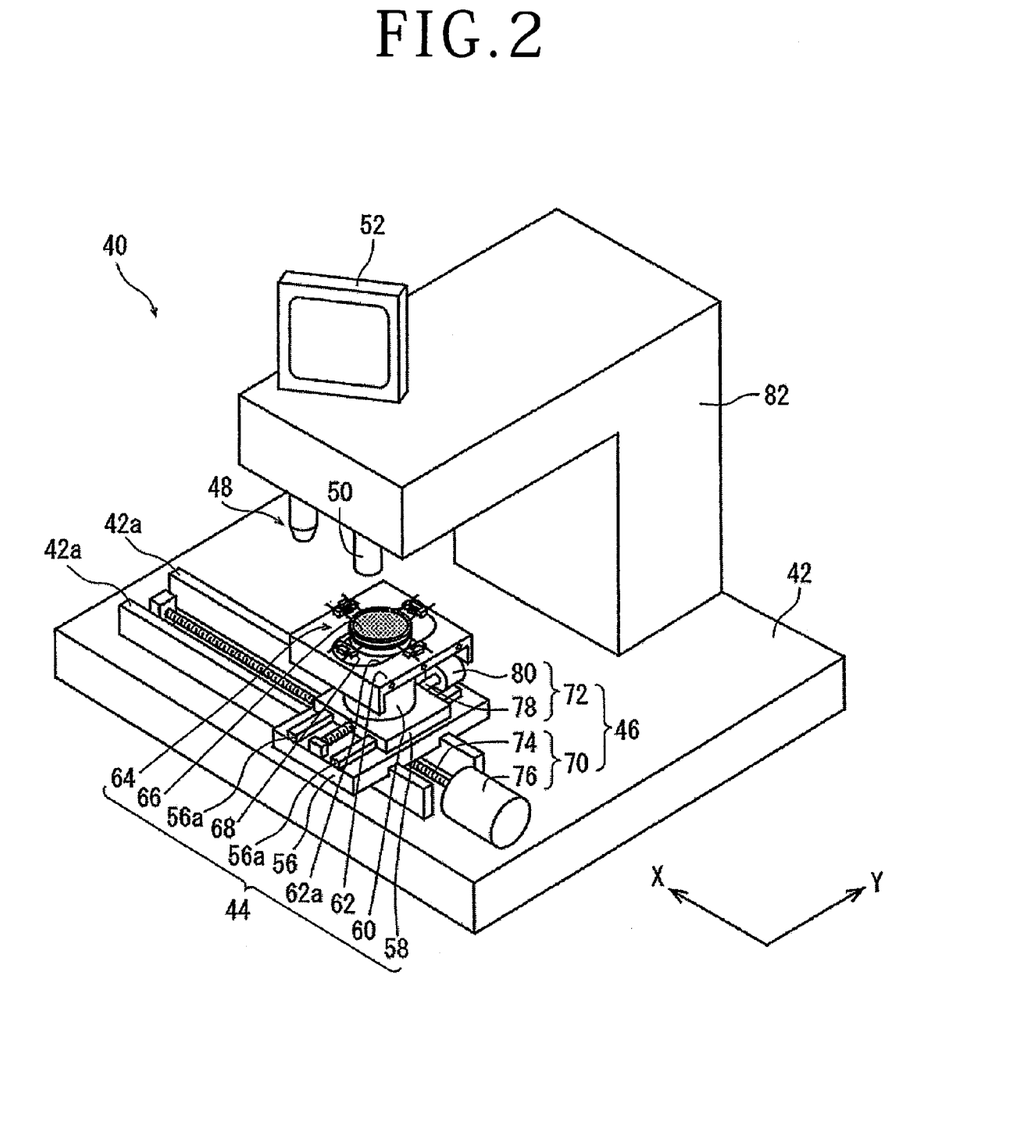
FIG. 2 is a general perspective view of a laser processing apparatus for performing a welding step of welding the cover plate and the wafer.

After performing the cover plate providing step, a welding step is performed in the following manner. FIG. 2 is a general perspective view of a laser processing apparatus 40 for performing the welding step according to the present invention. The laser processing apparatus 40 includes a base 42, holding means 44 for holding a workpiece such as a wafer, moving means 46 for moving the holding means 44, laser beam applying means (partly not shown) for applying a laser beam to the workpiece held on the holding means 44, imaging means 50, and displaying means 52. The laser processing apparatus 40 further includes control means (not shown) configured by a computer. The control means functions to control each means mentioned above.

The holding means 44 includes a rectangular X movable plate 56 mounted on the base 42 so as to be movable in an X direction, a rectangular Y movable plate 58 mounted on the X movable plate 56 so as to be movable in a Y direction, a cylindrical support 60 fixed to the upper surface of the Y movable plate 58, and a rectangular cover plate 62 fixed to the upper end of the support 60. The cover plate 62 is formed with an elongated hole 62*a* extending in the Y direction. A circular chuck table 64 is rotatably mounted on the upper end of the support 60 so as to extend upward through the elongated hole 62*a* of the cover plate 62. A circular vacuum chuck 66 is provided on the upper surface of the chuck table 64. The vacuum chuck 66 has a substantially horizontal holding surface. The vacuum chuck 66 is formed of a porous material. The vacuum chuck 66 is connected through a suction passage formed in the support 60 to suction means (not shown). A plurality of clamps 68 are provided on the outer circumference of the chuck table 64 so as to be spaced in the circumferential direction thereof. The X direction is defined as the direction shown by an arrow X in FIG. 2, and the Y direction is defined as the direction shown by an arrow Y in FIG. 2, which is perpendicular to the X direction in an XY plane. The XY plane defined by the X direction and the Y direction is a substantially horizontal plane.

The moving means 46 includes X moving means 70, Y moving means 72, and rotating means (not shown). The X moving means 70 includes a ball screw 74 extending in the X direction on the base 42 and a motor 76 connected to one end of the ball screw 74. The ball screw 74 has a nut portion (not shown), which is fixed to the lower surface of the X movable plate 56. The X moving means 70 is operated in such a manner that the rotational motion of the motor 76 is converted into a linear motion by the ball screw 74 and this linear motion is transmitted to the X movable plate 56, so that the X movable plate 56 is moved in the X direction along a pair of guide rails 42*a* provided on the base 42. Similarly, the Y moving means 72 includes a ball screw 78 extending in the Y direction on the X movable plate 56 and a motor 80 connected to one end of the ball screw 78. The ball screw 78 has a nut portion (not shown), which is fixed to the lower surface of the Y movable plate 58. The Y moving means 72 is operated in such a manner that the rotational motion of the motor 80 is converted into a linear motion by the ball screw 78 and this linear motion is transmitted to the Y movable plate 58, so that the Y movable plate 58 is moved in the Y direction along a pair of guide rails 56*a* provided on the X movable plate 56. The rotating means is built in the support 60 to rotate the chuck table 64, or the vacuum chuck 66 with respect to the support 60.

An L-shaped casing 82 is provided on the base 42 at its rear end portion. The L-shaped casing 82 is composed of a vertical portion extending upward from the upper surface of the base 42 and a horizontal portion extending from the upper end of the vertical portion in a substantially horizontal direction. The laser beam applying means includes pulsed laser beam oscillating means (not shown) built in the casing 82 and focusing means 48 provided on the lower surface of the front end portion of the casing 82. The imaging means 50 is also provided on the lower surface of the front end portion of the casing 82 so as to be spaced from the focusing means 48 in the X direction. The focusing means 48 and the imaging means 50 are positioned above the guide rails 42a. Accordingly, by moving the chuck table 64 along the guide rails 42a, the imaging means 50 and the focusing means 48 can image and process the workpiece held on the chuck table 64. The displaying means 52 is mounted on the upper surface of the front end portion of the casing 82. An image signal obtained by the imaging means 50 is output through the control means to the displaying means 52.

The welding step using the laser processing apparatus 40 mentioned above will now be described. First, the composite wafer W supported through the adhesive tape T to the annular frame F is placed on the vacuum chuck 66 of the chuck table 64 in the condition where the adhesive tape T is in contact with the upper surface of the vacuum chuck 66. Thereafter, the suction means (not shown) connected to the vacuum chuck 66 is operated to hold the composite wafer W through the adhesive tape T on the vacuum chuck 66 under suction. Further, the annular frame F is fixed by the clamps 68. Accordingly, the cover plate 20 of the composite wafer W held on the vacuum chuck 66 is oriented upward (wafer holding step).

After performing the wafer holding step, the chuck table 64 holding the composite wafer W is moved to a position directly below the imaging means 50 by operating the X moving means 70. When the chuck table 64 is positioned directly below the imaging means 50, an alignment step for detecting a subject area of the composite wafer W to be laser-processed is performed by the imaging means 50 and the control means (not shown). More specifically, the imaging means 50 and the control means perform image processing such as pattern matching for making the alignment between the division lines 14 of the composite wafer W and the focusing means 48 of the laser beam applying means, wherein the division lines 14 are formed on the front side 10a of the wafer 10 constituting the composite wafer W, and the focusing means 48 is adapted to apply a laser beam along each division line 14. Thus, the alignment for a laser beam applying position is performed.

After performing the alignment step, the chuck table 64 is moved to a laser beam applying area where the focusing means 48 for applying a laser beam is located. Further, one end of a predetermined one of the division lines 14 formed on the wafer 10 of the composite wafer W is positioned directly below the focusing means 48. At this time, at one end of the predetermined division line 14, the position shifted from the lateral center of the predetermined division line 14 toward one of the adjacent devices 12 (in the Y direction) by an amount of 20 µm, for example, is set directly below the focusing means 48. Further, the focal point of a pulsed laser beam to be applied from the focusing means 48 is set at the interface between the wafer 10 and the cover plate 20 of the composite wafer W. Thereafter, a pulsed laser beam having a transmission wavelength to the cover plate 20 of the composite wafer W is applied from the focusing means 48 to the composite wafer W, and at the same time the chuck table 64 is moved in the direction shown by an arrow +X in FIG. 3A at a predetermined feed speed. When the other end of the predetermined division line 14 has reached the position directly below the focusing means 48, the application of the pulsed laser beam is stopped and the movement of the chuck table 64 is also stopped.

Figure 3A:
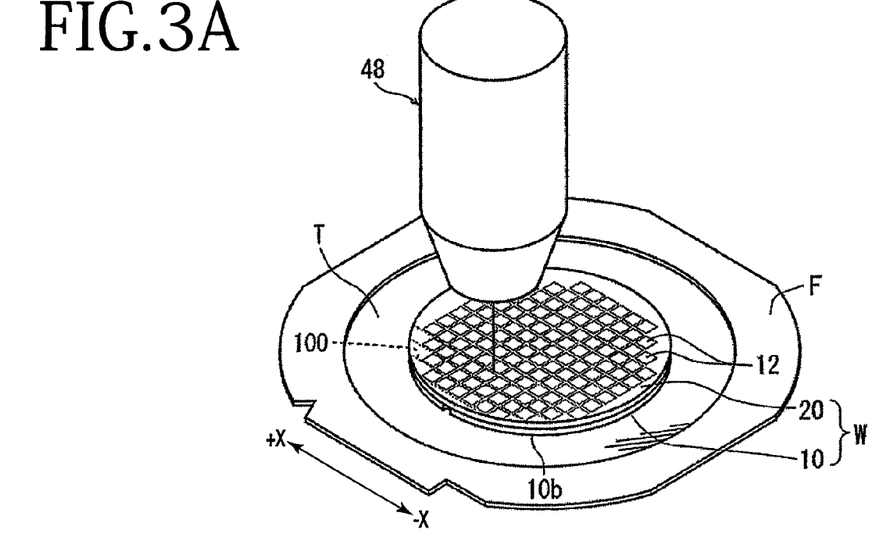
FIG. 3A is a perspective view showing the welding step using the laser processing apparatus shown in FIG. 2.

Thereafter, the chuck table 64 is moved in the Y direction by an amount of 40 µm, for example, toward one of the adjacent devices 12 at the other end of the predetermined division line 14 (in the direction opposite to the shifting direction at one end of the predetermined division line 14).

Figure 3B:
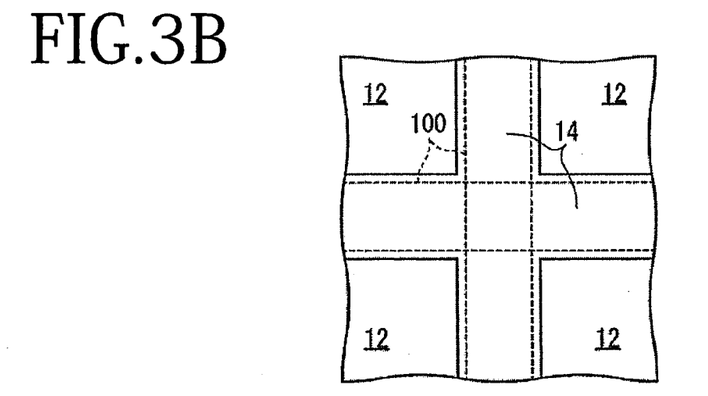
FIG. 3B is an enlarged plan view of an essential part of the composite wafer processed by the welding step.
Figure 3C:
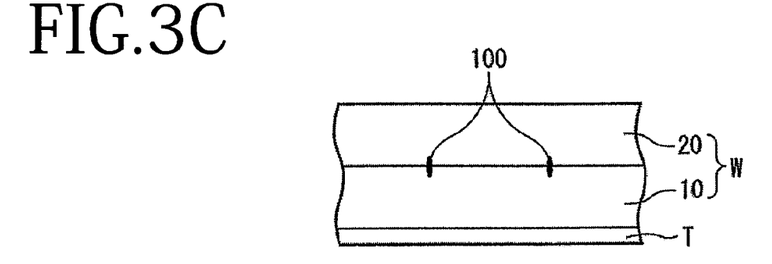
FIG. 3C is an enlarged sectional view of the essential part shown in FIG. 3B.

As a result, at the other end of the predetermined division line 14, the position shifted from the lateral center of the predetermined division line 14 toward one of the adjacent devices 12 (in the direction opposite to the shifting direction at one end of the predetermined division line 14) by an amount of 20 µm is set directly below the focusing means 48. Thereafter, the pulsed laser beam is similarly applied from the focusing means 48 to the composite wafer W, and at the same time the chuck table 64 is moved in the direction shown by an arrow −X in FIG. 3A, so that the pulsed laser beam is applied along the predetermined division line 14 from the other end to one end thereof. Such laser processing is similarly performed along all of the other division lines 14. Accordingly, two parallel welded lines 100 are formed along each division line 14 as shown in FIGS. 3B and 3C, wherein FIG. 3B is an enlarged plan view of an essential part of the composite wafer W and FIG. 3C is an enlarged sectional view of the essential part shown in FIG. 3B. As shown in FIGS. 3B and 3C, the wafer 10 and the cover plate 20 are melted and then resolidified at the interface therebetween along the two parallel welded lines 100 by the application of the pulsed laser beam. The two parallel welded lines 100 along each division line 14 are formed on opposite sides of the lateral center of each division line 14, or on opposite sides of a cut line to be formed later in a dividing step of dividing the composite wafer W into individual device chips. Accordingly, the wafer 10 and the cover plate 20 are firmly joined together by the two parallel welded lines 100 along each division line 14. In this manner, the welding step by the application of a laser beam is completed.

In the above preferred embodiment, the wafer 10 is first supported through the adhesive tape T to the annular frame F. Thereafter, the cover plate 20 is provided on the front side 10a of the wafer 10 to form the composite wafer W. Thereafter, the composite wafer W is held on the chuck table 64 of the laser processing apparatus 40, and a laser beam is applied to the composite wafer W from the cover plate 20 side in the welding step (that is, the cover plate 20 is oriented upward). The above preferred embodiment may be modified in the following manner.

Figure 4A:
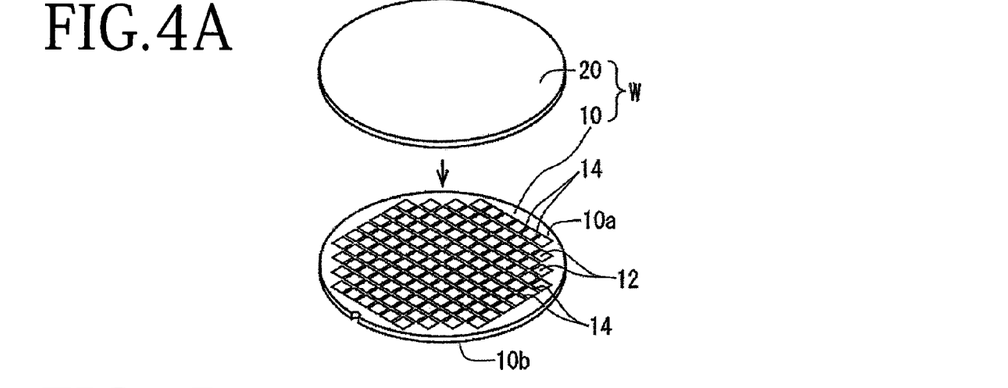
FIG. 4A is a perspective view showing a cover plate providing step according to a modification of the above preferred embodiment.
Figure 4B:
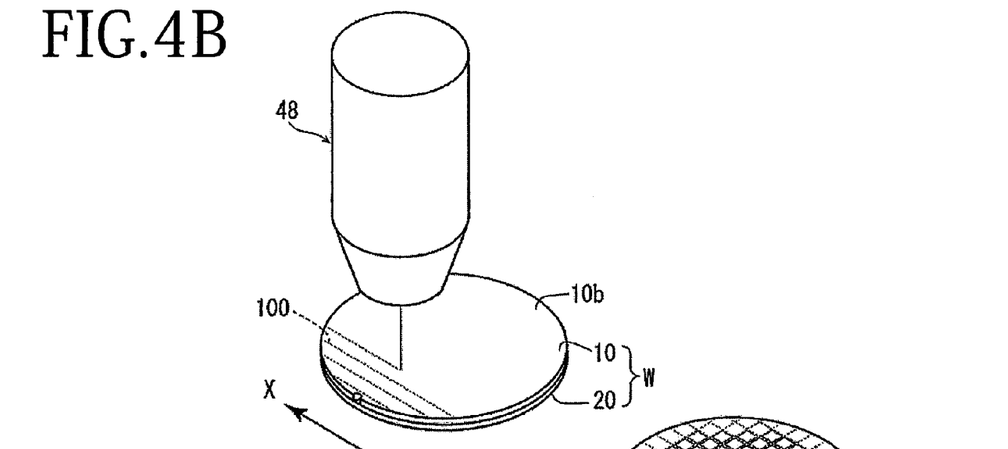
FIG. 4B is a perspective view showing a welding step according to this modification.
Figure 4C:
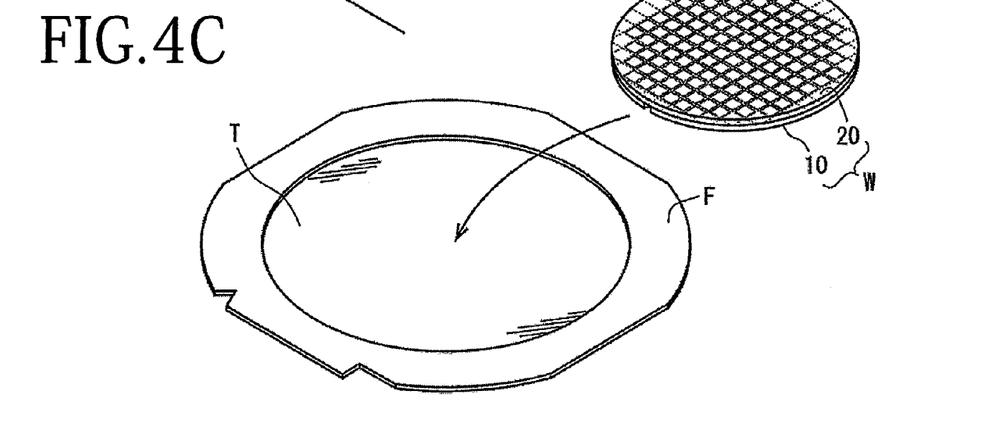
FIG. 4C is a perspective view showing a supporting step of supporting the composite wafer through an adhesive tape to an annular frame according to this modification.

As shown in FIG. 4A, the cover plate 20 is first provided on the front side 10a of the wafer 10 to form the composite wafer W before supporting the wafer 10 through the adhesive tape T to the annular frame F. Thereafter, as shown in FIG. 4B, the composite wafer W is placed on the vacuum chuck 66 of the chuck table 64 in the laser processing apparatus 40 (see FIG. 2) in the condition where the cover plate 20 is oriented downward, i.e., the back side 10b of the wafer 10 is oriented upward. Then, the composite wafer W is held on the vacuum chuck 66 under suction. In this condition, the welding step is similarly performed by applying a laser beam from the focusing means 48 to the composite wafer W. In this modification, the laser beam is applied to the composite wafer W from the wafer 10 side. Accordingly, as similar to the above preferred embodiment, two parallel welded lines 100 are formed along each division line 14, wherein the wafer 10 and the cover plate 20 are melted and then resolidified at the interface therebetween along the two parallel welded lines 100. The two parallel welded lines 100 along each division line 14 are formed on opposite sides of the lateral center of each division line 14, or on opposite sides of a cut line to be formed later in a dividing step of dividing the composite wafer W into individual device chips. Accordingly, the wafer 10 and the cover plate 20 are firmly joined together by the two parallel welded lines 100 along each division line 14. After performing the welding step along all of the division lines 14, as shown in FIG. 4C, the back side 10*b* of the wafer 10 constituting the composite wafer W is attached to the adhesive tape T supported at its peripheral portion to the annular frame F in the condition where the composite wafer W is set in the inside opening of the annular frame F closed by the adhesive tape T (supporting step), thus obtaining the same condition as that obtained after completing the welding step in the above preferred embodiment.

For example, the laser processing in the welding step is performed under the following processing conditions.

Wavelength: 532 to 1550 nm
(in the case that the laser beam enters the cover plate 20 formed of glass), or
1064 to 3000 nm
(in the case that the laser beam enters the wafer 10 formed of silicon)
Repetition frequency: 50 kHz
Average power: 1 W
Power/pulse: 20 ρJ
Spot diameter: 20 μm
Work feed speed: 100 mm/second
Overlap ratio: 90%

Of the above processing conditions, the power of the laser beam may be set to a relatively low power such that the interface between the wafer 10 and the cover plate 20 is not completely broken by the laser beam, but both members are melted and then resolidified to be welded. Further, the wavelength of the laser beam is not limited to the above wavelength, but may be suitably set to a transmission wavelength to the wafer 10 or the cover plate 20 which the laser beam enters.

Figure 5A:
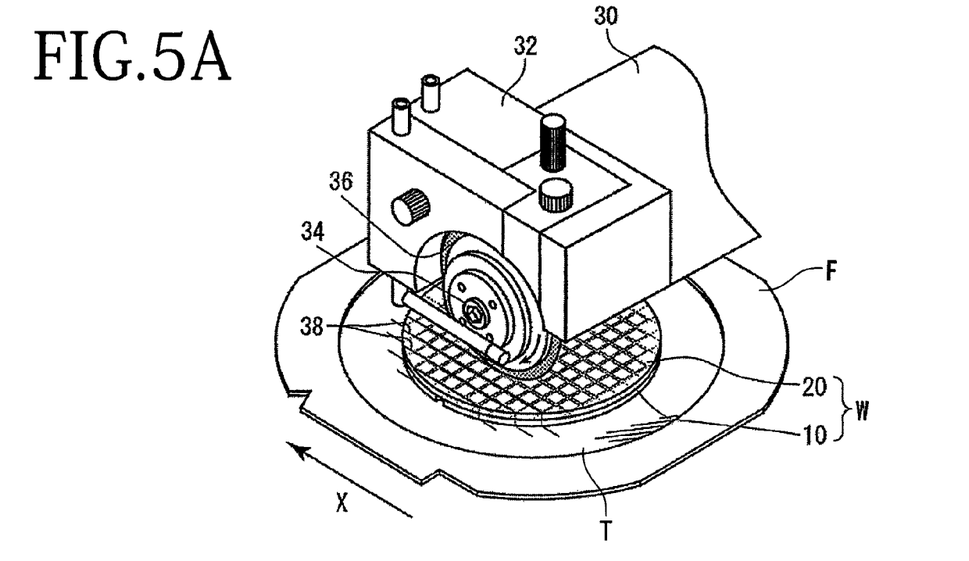
FIG. 5A is a perspective view showing a dividing step of dividing the composite wafer by using a cutting blade.
Figure 5B:
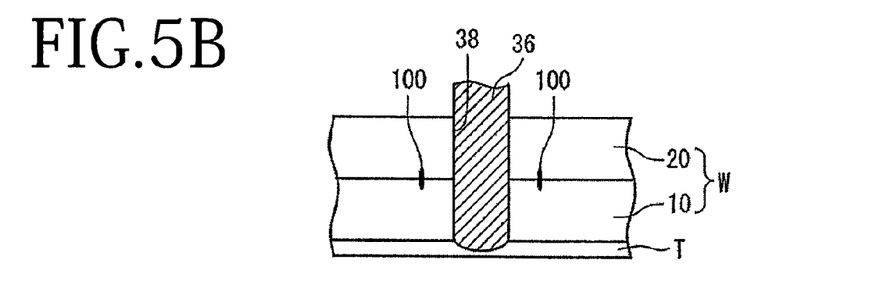
FIG. 5B is an enlarged sectional view of an essential part of the composite wafer in performing the dividing step.
Figure 5C:
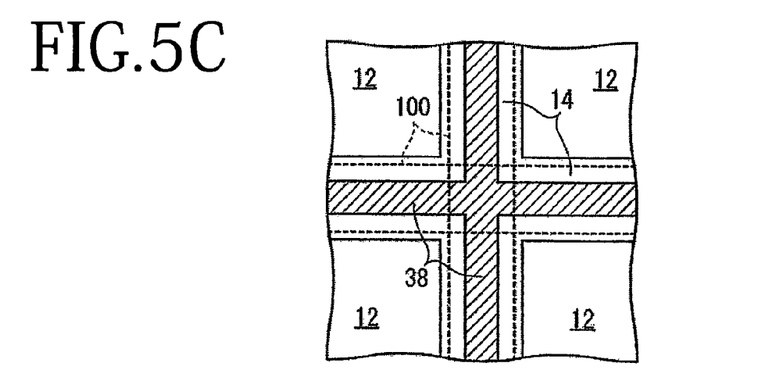
FIG. 5C is an enlarged plan view showing the relation between cut lines and devices of the composite wafer processed by the dividing step.

After performing the welding step, a dividing step shown in FIGS. 5A to 5C is performed. FIGS. 5A to 5C show the dividing step of forming a cut line for dividing the composite wafer W along each division line 14 formed on the wafer 10, from the cover plate 20 side, thereby obtaining the individual devices 12 each covered with the cover plate 20.

As shown in FIG. 5A, the dividing step is performed by using a cutting apparatus (a part of which being shown) having a spindle unit 30. The spindle unit 30 includes a spindle housing 32 and a spindle 34 rotatably mounted in the spindle housing 32, wherein a front end portion of the spindle 34 projects from the spindle housing 32 and a cutting blade 36 is fixed to the front end portion of the spindle 34. As described above, the composite wafer W having a predetermined thickness (e.g., 400 μm) includes the wafer 10 whose front side 10*a* is partitioned into a plurality of separate regions by the division lines 14, and the plural devices 12 are formed in these separate regions. In performing the dividing step, the composite wafer W supported through the adhesive tape T to the annular frame F is held under suction on a holding table (not shown) included in the cutting apparatus in the condition where the adhesive tape T is in contact with the upper surface of the holding table. Thereafter, the cutting blade 36 fixed to the spindle 34 is rotated at a high speed and then lowered to cut in the composite wafer W. Thereafter, the holding table and the cutting blade 36 are relatively moved in a feeding direction to thereby form a cut line 38 along each division line 14 as shown in FIGS. 5A and 5B, wherein FIG. 5A is a perspective view showing the dividing step and FIG. 5B is an enlarged sectional view of an essential part of the composite wafer W cut by the cutting blade 36. More specifically, the cut line 38 is formed between the two parallel welded lines 100 formed along each division line 14 in the welding step. The cut line 38 has a depth reaching the adhesive tape T attached to the back side 10*b* (lower surface) of the wafer 10, from the upper surface of the cover plate 20. That is, the composite wafer W is fully cut by the cut line 38. Further, the cut line 38 has a predetermined width (e.g., 30 μm). In FIG. 5B, the cut line 38 is so shown as to be emphasized for convenience of illustration and not in accordance with an actual size.

In the cutting apparatus, the cutting blade 36 is movable in a feeding direction shown by an arrow X in FIG. 5A and also movable in an indexing direction perpendicular to the feeding direction in a horizontal plane. The cutting blade 36 is further vertically movable with respect to the composite wafer W. The movement of the cutting blade 36 in each direction can be controlled in accordance with a program previously stored. FIG. 5C is an enlarged plan view of an essential part of the composite wafer W cut by the cutting blade 36. As shown in FIG. 5C, the cut line 38 is formed along each division line 14 of the composite wafer W. In this manner, the composite wafer W is divided into the individual devices 12 each covered with the cover plate 20. Thus, the dividing step using the cutting blade 36 is completed.

In the dividing step mentioned above, the cutting apparatus having the cutting blade 36 is used to form the cut line 38 along each division line 14, thereby dividing the composite wafer W into the individual devices 12. However, the present invention is not limited to this configuration, but any other dividing means may be used to perform the dividing step. For example, a laser processing apparatus may be used to perform the dividing step. In this case, a laser beam is applied to the composite wafer W in the condition where the power of the laser beam per pulse is set to 60 μJ, for example, and the focal point of the laser beam is set at the lateral center between the two parallel welded lines 100 formed along each division line 14, thereby forming a cut line along each division line 14. While the cut line is formed as a groove having a depth reaching the adhesive tape T attached to the back side 10*b* of the wafer 10, from the upper surface of the cover plate 20, the cut line is not always formed as a groove in the present invention. For example, a laser beam having a transmission wavelength to the cover plate 20 and the wafer 10 may be applied to the composite wafer W in the condition where the focal point of the laser beam is set inside the composite wafer W, thereby forming a modified layer inside the composite wafer W along each division line 14. Thereafter, an external force may be applied to the composite wafer W to thereby divide the composite wafer W into the individual devices 12.

As described above, the composite wafer W can be divided into the individual devices 12 (device chips) each covered with the cover plate 20 without using an adhesive. Accordingly, there is no possibility that the adhesive may squeeze out from the side surface of each device chip covered with the cover plate 20, causing a reduction in quality of each device chip. Further, in the welding step, the periphery of each device 12 formed on the wafer 10 is welded to the cover plate 20 by the two parallel welded lines 100 along each division line 14, thereby firmly joining the wafer 10 and the cover plate 20. Accordingly, in performing the dividing step using the cutting apparatus, there is no possibility that the cover plate 20 may be separated from the wafer 10.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into individual device chips along a plurality of crossing division lines, a front side of said wafer being partitioned by said division lines to define a plurality of separate regions where a plurality of devices corresponding to said device chips are formed, said wafer processing method comprising:
   a cover plate providing step of providing a cover plate on the front side of said wafer to thereby form a composite wafer;
   a welding step of applying a laser beam having a transmission wavelength to said wafer or said cover plate along each division line in the condition where the focal point of said laser beam is set at the interface between said wafer and said cover plate on opposite sides of the lateral center of each division line, after performing said cover plate providing step, thereby forming two parallel welded lines for joining said wafer and said cover plate along each division line; and
   a dividing step of forming a cut line between said two parallel welded lines formed along each division line after performing said welding step, thereby cutting said composite wafer along each division line to obtain said individual device chips each covered with said cover plate.

2. The wafer processing method according to claim 1, wherein said dividing step is performed by rotating a cutting blade set at the lateral center between said two parallel welded lines.

3. The wafer processing method according to claim 1, wherein said dividing step is performed by applying a laser beam whose focal point is set at the lateral center between said two parallel welded lines.

4. The wafer processing method according to claim 1, further comprising
   a supporting step of supporting said composite wafer through an adhesive tape to an annular frame having an inside opening in such a manner that said composite wafer is set in said inside opening closed by said adhesive tape, after performing said welding step and before performing said dividing step.

\* \* \* \* \*